United States Patent [19]

Marmet

[11] 4,399,373
[45] Aug. 16, 1983

[54] FET POWER SUPPLY FOR MOS MEMORIES

[75] Inventor: Melvin L. Marmet, Norco, Calif.

[73] Assignee: Rockwell International Corporation, El Segundo, Calif.

[21] Appl. No.: 315,790

[22] Filed: Oct. 28, 1981

Related U.S. Application Data

[62] Division of Ser. No. 120,239, Feb. 11, 1980, Pat. No. 4,355,247.

[51] Int. Cl.³ .............................................. H03K 3/01
[52] U.S. Cl. ................................ 307/296 R; 307/574; 307/513
[58] Field of Search ............... 307/296 A, 296 R, 530, 307/581, 574

[56] References Cited

U.S. PATENT DOCUMENTS 3,753,011  8/1973  Faggin ............................ 307/296 R
3,863,179  1/1975  Goo ................................. 307/296 A Primary Examiner—Stanley D. Miller
Assistant Examiner—B. P. Davis
Attorney, Agent, or Firm—H. Fredrick Hamann; Wilfred G. Caldwell

[57] ABSTRACT

The invention applies a reference voltage to a responsive means for producing a signal of one type in the absence of a semi-conductor at the addressed memory location, and applies a voltage less than the reference voltage to the responsive means for producing a signal of another type if a semi-conductor is present at the addressed memory location.

The reference voltage is produced by a novel constant low voltage variable current source. The responsive means comprises inverter amplifier means. The reference voltage centers the small voltage swing on the bit line to the trigger point of the inverter amplifier. The means for determining the magnitude of voltage applied to the inverter is a pull up FET in series with the memory FET at the addressed location. If the electrical resistance of the FETs is similar, one half of the reference voltage will be applied to the inverter and it produces an off, or nearly off, type signal indicating presence; otherwise in the absence of a memory FET, full reference voltage is applied to the inverter to produce an on type signal indicating absence.

Thus, the sense amplifier is independent of any reference voltage tracking the midpoint of the small bit line swing, and it is faster, requires less die area and restores full MOS output from a one volt signal swing.

2 Claims, 1 Drawing Figure

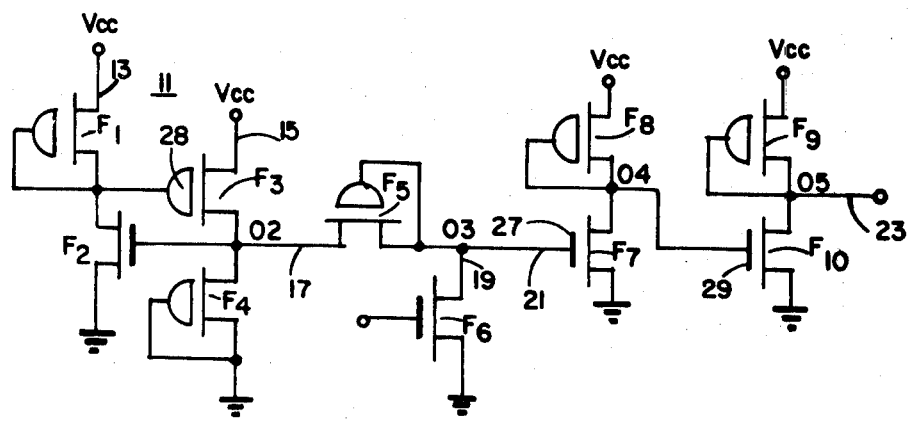

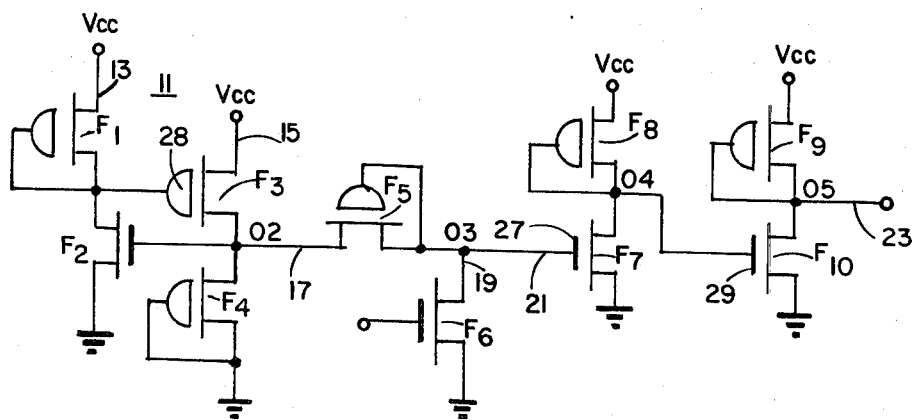

FET POWER SUPPLY FOR MOS MEMORIES

This application is a division of application Ser. No. 120,239, filed 2/11/80, now U.S. Pat. No. 4,355,247, issued 10/19/82.

FIELD OF THE INVENTION

The invention relates to sense amplifiers, and particularly for small bit line swings with short propagation delays for high speed MOS memories.

THE PRIOR ART

The prior art sense amplifiers rely on differential amplifiers which require reference sources and add more stages. The reference must track the center point of the voltage swing. The present invention avoids these requirements by employing the switching point of an inverter to determine the logic from the bit lines, so there is no dependency on a reference generated in parallel or in series with the active signal. The reference of the subject invention is generated on the side and is the power supply.

BRIEF DESCRIPTION OF THE INVENTION

The invention may be regarded as a double inverter amplifier with a depletion pull-up to a constant low voltage supply. Its application is for evaluating small signal levels from memories in which reduced voltage transitions require longer to make such excursions. In this concept, instead of pulling the memory one pull level +5 volts, it is going to be pulled to only 2 volts. Thus, the invention includes a method of and apparatus for generating the constant voltage level from a variable current source having a constant voltage output of 2 volts regardless of load, and implemening such source in the sensing of the lower level voltage bit line swings. In this manner a ROM may be addressed and read to determine whether the program logic is zero or one with the signal level being reinforced to MOS levels.

The constant low voltage variable current source may comprise a power supply employing four semiconductor devices with feedback for developing the reference level for the bit lines. A pull-up semiconductor is located in the output line of the power supply and a bit line is connected to the output lead of the power supply which line may include the presence or absence of a memory semiconductor device at the addressed location. It is preferable that the pull-up semiconductor and the ROM cell or memory semiconductor be ratioed to provide approximately a one volt swing from the readout so that the upper level is the two volts reference and the zero level would be approximately one volt. This enables centering the swing around the threshold of a further large semiconductor device connected with a related or ratioed semiconductor device as an inverter amplifier stage. In this manner, maximum amplification of a small signal transition is obtained by operating on it around the threshold of the large semiconductor so that it can translate a signal of one volt signal swing into full MOS using a simple inverter signal. Preferably, a second inverter stage is provided for amplifying the input of the first inverter stage to insure full MOS at five volts and to isolate the driving without loading the circuit.

The ratio in the first inverter circuit is approximately 20 to 1 wherein the semiconductor receiving the bit line signal has 20 times the electrical resistance of its companion semiconductor in the first stage of the inverter. In this manner, the input semiconductor is very sensitive to any change at the bit line so that at threshold level it wants to go to the one level but it doesn't have to go very high in reference to its threshold to turn on to make a very low resistance for a very sensitive output.

The other ratio of importance to the operation of this circuitry is that of the pull-up semiconductor to the memory cell semiconductor. They should be similar or look alike, then no matter what happens to one, it happens to the other such that the voltage tends to remain constant.

Thus, it will be seen that the subject circuit employs a power supply reference, i.e. off to the side of the active circuitry, which feeds a pull-up semiconductor. The reference voltage is the upper level instead of a center reference, like prior art sensing amplifiers for ROMs.

In the prior art it is necessary to generate a reference that represents a center point of a voltage swing in order to sense whether it is up above or below in order to detect whether it is a one or a zero. The present system employs a switching point of the inverter stage to determine what the logic coming from the bit line is, i.e. one or zero. Thus, it is independent of any reference voltage generated in parallel or series with the active signal. It is generated over on the side in the form of the power supply, and represents the upper level, not the swing midpoint. It doesn't have to track the swing of the bit lines as far as the center positioning. It is the upper level of the swing, so it is completely divorced of inherent or built-in problems as far as tracking is concerned.

The bit line voltage swing is set by the ratio of the pull-up semiconductor to the memory semiconductor. The upper limit is the same voltage as the constant voltage output of the power supply and the lower limit is set by the ratio of the pull-up semiconductor to the memory cell semiconductor.

The advantages of this circuitry may now be appreciated in that the sense amplifier is simpler and requires less die area. The propagation delay is less through a two stage amplifier than four stage, as is required by the prior art. The sense amplifier does not require a reference that must track the midpoint of the bit line swing as in the prior art, and the operating voltage range is not limited by circuit design functions, as in the prior art.

The single FIGURE is a circuit diagram of the preferred embodiment of the invention.

DESCRIPTION OF THE PREFERRED EMBODIMENT

In the single FIGURE, the power supply or constant low voltage variable current source 11, comprises the four FETs, F1, F2, F3, and F4. The source power, for the power supply 11, $V_{CC}$ is applied to the drain leads 13 for FET F1, and 15 for FET F3. $V_{CC}$ may vary from 3.5 to 10 volts and still provide a predetermined reference level of e.g. 2 volts at output lead 17.

The pull-up FET is F5 and the ROM memory FET is F6 with a single bit line being represented at 19. It will be understood of course that a single power supply 11 may provide a reference voltage for the simultaneous sampling of large numbers of bit lines for determining programming of an ROM, as addressed.

FETs F7 and F8 comprise the first stage of an inverter amplifier which is very sensitive to the signal on lead 21 which is indicative of the presence or absence of a memory cell F6 at the addressed location. FETs F9 and F10 comprise a further inverter amplifier stage which generates a full level signal on node 05, which is provided for connection to an output driver or the like over lead 23.

Turning now to operation of the power supply, depletion FET F4 comprises the load and the depletion FET F3 is the main source of current for power supply from dc input terminal $V_{CC}$ which may be set at anywhere from 3.5 to 10 volts for the 2 volt reference output on lead 17 at node 02.

Considering the load F4, it is a constant load because in the memory array, it is not known whether there are going to be FETs or no FETs at any particular address, thus the circuit could experience no load conditions. With F4 serving as a constant load, the voltage at node 02 doesn't elevate above the 2 volt reference level selected.

In the other condition, every bit line in the ROM array may have a current path to ground, i.e. presence of the memory FET 2 at each address. To adjust for this additional current requirement FET F2 supplies feedback to control the potential of the gate 28 at FET 3 so it can supply current as required. While the power supply is somewhat regulated, it should be mentioned that it is not critical because it is the upper level at node 03 which is the reference level and it is always the upper level; never required to be the mid point or to track the mid point. This is an advantage of this present circuitry because MOS FETs tend to vary and, the present design is insensitive to such variation. F3 is larger than F4 in resistive electrical characteristics, for example, a ratio of 3/1 is satisfactory. The ratio of FET F1 to F2 depends on the threshold of F3 and what the feedback ratio is and this is best determined empirically. Fine adjustments in the output voltage at node 02 may be made by changing the size of F2.

FET F3 is an active device in the circuitry and is selected as a depletion type FET for its constant current mode, i.e. the voltage at node 02 is going to be somewhat constant regardless of the current drawn.

It has been mentioned that the voltage at $V_{CC}$ may vary over a range of 3.5 to 10 volts but it is normally selected at 5 volts for the application presented. Hence, in summary, the power supply 11 sets the upper level of the swing of mode 03 and that is important to the operation of the circuitry, and the upper level reference allows it to operate better than a conventional sense amplifier which requires a reference at the midpoint of the logic signal. Both depletion FETs F3 and F4 are normally on and node 01 controls the amount of conduction in F3. This is a matter of adjusting the current flow to node 02.

The initial voltage of 2 volts is set at node 02 in the absence of current flow in pull-up FET F5. Once FET F5 starts drawing current, it is necessary to supply the current from F3 and thus the adjustment of feed back from node 02 to node 01 accomplishes this requirement. A criteria for operation is the current through F4 should be twice that drawn by all bit line pull ups (F5) for best regulation. The low voltage at node 02, e.g. two volts is required to center the small voltage swing on the bit line at node 03 to the trigger point of the inverter F7–F8.

The bit line voltage swing is set by the ratio of FETS F5 to F6. While only one pull-up FET F5 and one cell FET F6 are shown, it will be realized that there are usually one pull-up for each output and a decoding matrix may select 16 to 32 bit lines. Alternatively, the circuit could be duplicated for each bit line and utilized in the simplified illustration.

By substantially matching the resistance characteristics of FETs F5 and F6, the bit line signal swing may be limited to a one volt swing downwardly from the two volt reference level such that in the absence of an FET, a logic one is two volts at node 03, whereas if the FET F6 is present, the swing will be down to about a one volt level for a logic zero.

The inverter amplifiers F7 through F10 amplify and reinforce such signals at node 03 to full MOS output signals at node 05.

The purpose of selecting two volts to one volt switching range by ratioing F5 and F6 is so that centering may take place around the threshold of an enhancement FET F7. Maximum amplification of a small signal transition is obtained by operating such signals around a threshold of an enhancement device which translates a poor signal, one volt swing into full MOS with just a simple inverter. The second inverter amplifier F9–F10 insures full MOS enabling the driving of more loading, otherwise if it were loaded down it would become slow.

The ratio between F7 and F8 is very large, i.e. a resistance ratio of approximately 20/1, making F7 very large. This makes F7 very sensitive to any changes in voltage at node 03 because its resistance to voltage curve is very steep in the selected operating region so that node 04 makes very sensitive adjustments to changes at node 03.

Features of the invention may now be appreciated in that the invention generates a low two volt level, making use of a straight inverter as a result of this decreased level and employing the reference circuit in parallel with the active signal rather than in series with the active signal. This eliminates the need for a center point of the bit line and vastly increases the speed of operation. Thus, it is the combination of the power supply connected to a pull-up semiconductor and the memory cell semiconductor enabling the use of a straight inverter. It is now possible to use a straight inverter in its high gain node with a small signal because most of the FET lines are very high, i.e. elevated into higher voltage. Thus the invention provides a low voltage range so that a straight inverter could handle it. In this manner, memory logic modes are reliably detected.

In operation, and by definition the presence of a FET F6 at the addressed memory location will produce a logic zero at node 03, and the absence of such a FET will produce a one at node 03, it will first be assumed that F6 is present. Its presence tends to ground node 03 and since the characteristics of F5 and F6 are similar, node 03 drops to about one half the reference voltage which is two volts such that the presence becomes a logic zero at node 03 equal to approximately one volt. This decreases the voltage at gate 27 of FET F7 so that node 05 goes high. The gate 29 of FET F10 is high and thus node 05 goes low and this low on lead 23 is the output signal indicating the presence of a FET at the addressed memory location.

When there is no FET present at the location of F6, node 03 is high because there is no current drain across FET 6 to ground. F7 is thus conducting and node 04 goes low which in turn shuts off F10 so that node 05 goes high to indicate on output lead 23 the absence of an F6 FET.

Having thus set forth a preferred embodiment of the instant invention, what is claimed is:

1. A MOS FET power supply suitable for use in a sense amplifier for providing a substantially constant low voltage variable current source comprising in combination;

a current source FET and a load FET connected in series between a source of voltage and ground;

a second pair of FETs connected in series between said source of voltage and ground;

a feedback path from a junction of the current source FET and the load FET to a control gate for one of the FETs of said second pair; and a voltage control path from a junction of the second pair of FETs to a control gate for said current source FET.

2. The power supply of claim 1 wherein:

both FETs of said first pair are of the depletion type; and the FET of the second pair having said control gate being of the enhancement type, and the other FET of the second pair being of the depletion type.

* * * * *